(12) United States Patent
Li et al.

(10) Patent No.: US 12,243,774 B2
(45) Date of Patent: Mar. 4, 2025

(54) IMPURITY REMOVAL IN DOPED ALD TANTALUM NITRIDE

(71) Applicant: Applied Materials, Inc., Santa Clara, CA (US)

(72) Inventors: Rui Li, San Jose, CA (US); Xiangjin Xie, Fremont, CA (US); Tae Hong Ha, San Jose, CA (US); Xianmin Tang, San Jose, CA (US); Lu Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 498 days.

(21) Appl. No.: 17/853,150

(22) Filed: Jun. 29, 2022

(65) Prior Publication Data

US 2022/0328348 A1    Oct. 13, 2022

Related U.S. Application Data (63) Continuation of application No. 16/914,416, filed on Jun. 28, 2020, now Pat. No. 11,410,881.

(51) Int. Cl.
| | |
|---|---|
| *H01L 21/44* | (2006.01) |
| *C23C 16/34* | (2006.01) |
| *C23C 16/455* | (2006.01) |
| *H01L 21/768* | (2006.01) |

(52) U.S. Cl.
CPC ........ *H01L 21/76862* (2013.01); *C23C 16/34* (2013.01); *C23C 16/45544* (2013.01); *H01L 21/76843* (2013.01)

(58) Field of Classification Search
CPC ......... H01L 21/76862; H01L 21/76843; C23C 16/34; C23C 16/45544
See application file for complete search history.

(56) References Cited

U.S. PATENT DOCUMENTS

| | | |
|---|---|---|
| 2008/0142971 A1 | 6/2008 | Dordi et al. |
| 2008/0179747 A1 | 7/2008 | Sakai et al. |
| 2010/0311237 A1 | 12/2010 | Seutter et al. |
| 2011/0306203 A1 | 12/2011 | Dordi et al. |
| 2013/0140698 A1 | 6/2013 | Lakshmanan et al. |
| 2019/0385908 A1 | 12/2019 | Xie et al. |

FOREIGN PATENT DOCUMENTS

| | | |
|---|---|---|
| JP | 2005158761 A | 6/2005 |
| JP | 2010503204 A | 1/2010 |
| JP | 2016540368 A | 12/2016 |
| KR | 20190021184 A | 3/2019 |

OTHER PUBLICATIONS

PCT International Search Report and Written Opinion in PCT/US2021/039332 dated Oct. 21, 2021, 9 pages.

*Primary Examiner* — Victor A Mandala
*Assistant Examiner* — Colleen E Snow
(74) *Attorney, Agent, or Firm* — Servilia Whitney LLC (57) ABSTRACT

Methods of forming copper interconnects are described. A doped tantalum nitride layer formed on a copper layer on a substrate has a first amount of dopant. The doped tantalum nitride layer is exposed to a plasma comprising one or more of helium or neon to form a treated doped tantalum nitride layer with a decreased amount of dopant. Apparatus for performing the methods are also described.

20 Claims, 9 Drawing Sheets

IMPURITY REMOVAL IN DOPED ALD TANTALUM NITRIDE

CROSS-REFERENCE TO RELATED APPLICATIONS

This application is a Continuation of U.S. application Ser. No. 16/914,416, filed on Jun. 28, 2020, the entire disclosure of which is hereby incorporated by reference herein.

TECHNICAL FIELD

Embodiments of the disclosure generally relate to methods of forming barrier layers. In particular, embodiments of the disclosure relate to method for forming tantalum nitride barrier layers.

BACKGROUND

The miniaturization of semiconductor circuit elements has reached a point where feature sizes of 20 nm and less are fabricated on a commercial scale. As the critical dimensions continue to decrease in size, new challenges arise for process steps like filling a gap between circuit elements. As the width between the elements continues to shrink, the gap between them often gets taller and narrower, making the gap more difficult to fill and contacts more difficult to make robust.

Ruthenium doped tantalum nitride is being studies as a copper barrier material for smaller node applications. However, integrating ruthenium doped tantalum nitride into small features can result in copper/ruthenium corrosion due to, for example, electromigration of the copper immediately adjacent the ruthenium, breaking the connection.

Ruthenium (Ru) doped tantalum nitride (TaN) often contains high carbon (C) concentrations and is not efficiently or easily removed by in-situ $H_2$/Ar plasma during atomic layer deposition (ALD) tantalum nitride formation. Studies on ALD TaN densification in physical vapor deposition (PVD) chambers show that Ar plasma treatment can densify the ALD TaN films by selectively removing nitrogen (N).

Accordingly, there is a need for methods of forming barrier layers for contact formation.

SUMMARY

One or more embodiments of the disclosure are directed to methods of forming interconnects. A doped tantalum nitride layer is formed on a substrate. The doped tantalum nitride layer has a first amount of dopant comprising one or more of ruthenium, tungsten or cobalt. The doped tantalum nitride layer is exposed to a plasma comprising one or more of helium or neon to form a treated doped tantalum nitride layer with a second amount of dopant less than the first amount of dopant.

Additional embodiments of the disclosure are directed to cluster tools comprising one or more process chambers around a central transfer station. The one or more process chambers are configured to deposit a doped tantalum nitride film, anneal the doped tantalum nitride film and expose the annealed doped tantalum nitride film to a plasma comprising one or more of helium or neon. At least one controller is connected to the one or more process chambers and central transfer station. The at least one controller has one or more configurations selected from: a configuration to deposit a tantalum nitride film; a configuration to deposit a dopant-containing film; a configuration to anneal a substrate; a configuration to move the substrate between the one or more process chambers and central transfer station; and a configuration to expose the substrate to a neon plasma.

Further embodiments of the disclosure are directed to non-transitory computer readable medium including instructions, that, when executed by a controller of a processing chamber, causes the processing chamber to perform the operations of: depositing a tantalum nitride film on a substrate; depositing a dopant-containing film on the substrate; annealing the substrate; and exposing the substrate to a neon plasma.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure advantageously provide methods to reduce ruthenium (Ru), tungsten (W), cobalt (Co) and/or carbon (C) in a doped tantalum nitride (TaN) film. Some embodiments advantageously enhance the barrier properties of the film for a copper (Cu) interconnect.

In some embodiments, a helium (He) or neon (Ne) plasma is used to decrease the etch rate of the TaN film. In some embodiments, the etch selectivity of nitrogen to tantalum is increased. Some embodiments provide greater process controls by lower the etch rate and increasing the selectivity of the etch process. In some embodiments, a neon plasma treatment removes ruthenium from the TaN film and reduces the likelihood of copper corrosion in the contacts. Some embodiments remove carbon impurities to improve film resistivity. In some embodiments, the tantalum:nitrogen ratio is increased to improve barrier density.

Figure 1:
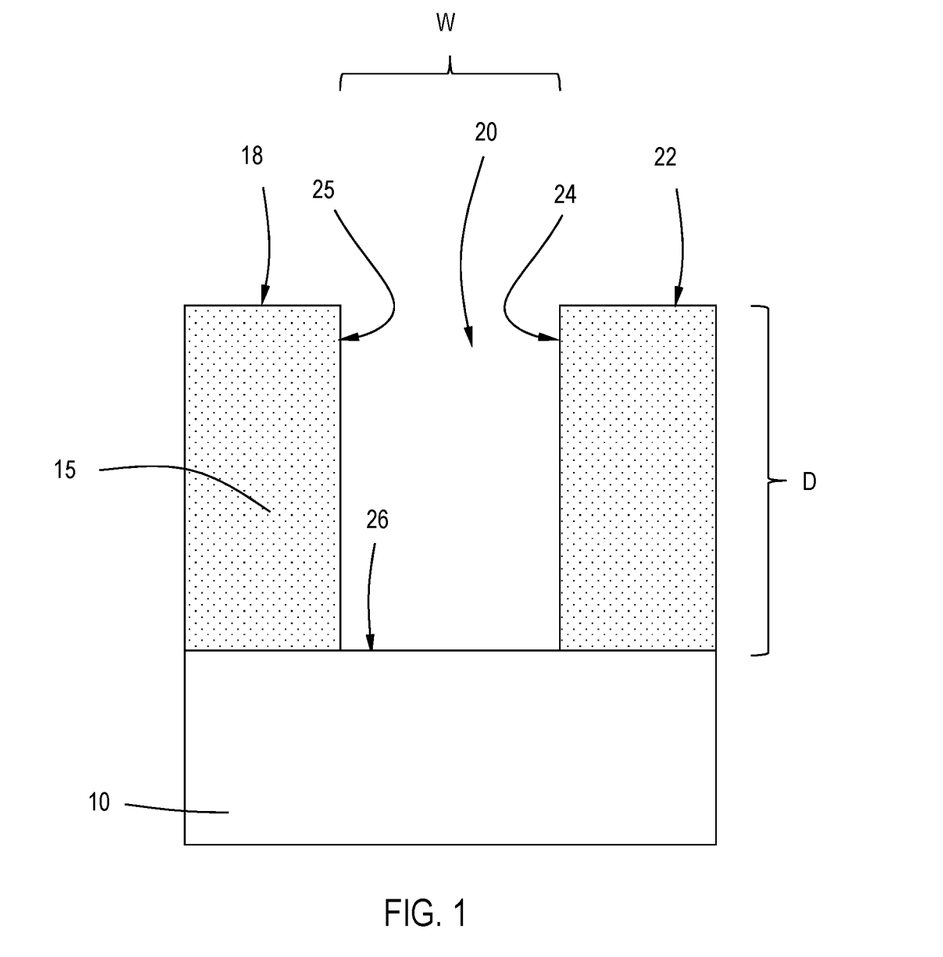
FIG. 1 shows a schematic representation of a substrate structure in accordance with one or more embodiments of the disclosure.

FIG. 1 illustrates a structure used in accordance with one or more embodiments. The substrate 10 illustrated in FIG. 1 includes a material 15 (e.g. a dielectric) with a structure 20 formed in the surface 18 thereof. The structure 20 has a top 22, bottom 26 and sides 24, 25. In the illustrated embodiment, the structure 20 is bounded on the bottom 26 and sides 24, 25 by the material 15. In some embodiments, the bottom 26 of the structure 20 is bounded by a different material (not shown) than the sides 24, 25. For example, the bottom 26 of the structure in some embodiments comprises a conductive material and the sides 24, 25 comprise a dielectric. In some embodiments, the bottom 26 of the structure 20 comprises a dielectric and the sides 24, 25 comprise a conductive material. In some embodiments, the bottom and sides are different materials and both bottom and sides are a dielectric or a conductive material.

The width W of the structure 20 is defined as the distance between the sides 24, 25. The skilled artisan will recognize that the structure illustrated is exemplary and that a typical structure may not have squared corners. The width of such a structure is measured as the average distance between the sidewalls measured parallel to the surface of the structure. The depth D of the structure is defined as the distance from the top 22 to the bottom 26 of the structure 20. The aspect ratio of the structure 20 is defined as the depth D:width W of the structure. In some embodiments, the aspect ratio is greater than or equal to 5:1, 10:1, 15:1, 20:1 or 25:1.

In some embodiments, the material 15 comprises a dielectric. Suitable dielectrics include, but are not limited to, silicon oxide (SiO), silicon dioxide ($SiO_2$), silicon nitride (SiN), silicon oxynitride (SiON), aluminum nitride (AlN), aluminum oxide (AlO) or a high-k dielectric material. In some embodiments, the material comprises a hardmask material (e.g., carbon (C)). As used in this specification and the appended claims, unless otherwise specified by subscripts, chemical formulae are representative of the elemental identity and are not intended to imply any particular stoichiometric ratios. For example, a titanium nitride (TiN) film can have any suitable combination of titanium and nitrogen atoms and are not limited to a unity relationship.

Some embodiments of the method comprise depositing tantalum nitride, a doped tantalum nitride, and a tantalum nitride film by atomic layer deposition or chemical vapor deposition (CVD) processes. One or more embodiments of the methods comprise sequentially depositing ruthenium doped tantalum nitride, tantalum nitride, ruthenium doped tantalum nitride films by atomic layer deposition or chemical vapor deposition processes. An in-situ plasma is applied in some embodiments to reduce the film impurities and incorporate the doping layer into the TaN layer improving barrier and/or adhesion properties.

In some embodiments, a physical vapor deposition (PVD) treatment with high density plasma and bias-able pedestal further improves one or more of barrier performance, carbon and/or ruthenium content without damaging a low-k dielectric.

In some embodiments, neon or helium plasma exposure increases the etch selectivity between tantalum and nitrogen (atomic selectivity). Some embodiments provide methods to control damage on a beveled surface (geometry selectivity). One or more embodiments decrease the deposition rate by greater than or equal to about 30% allowing greater process controllability. In some embodiments, an integrated hardware solution with a DC/RF coil process chamber is provided.

Figure 2:
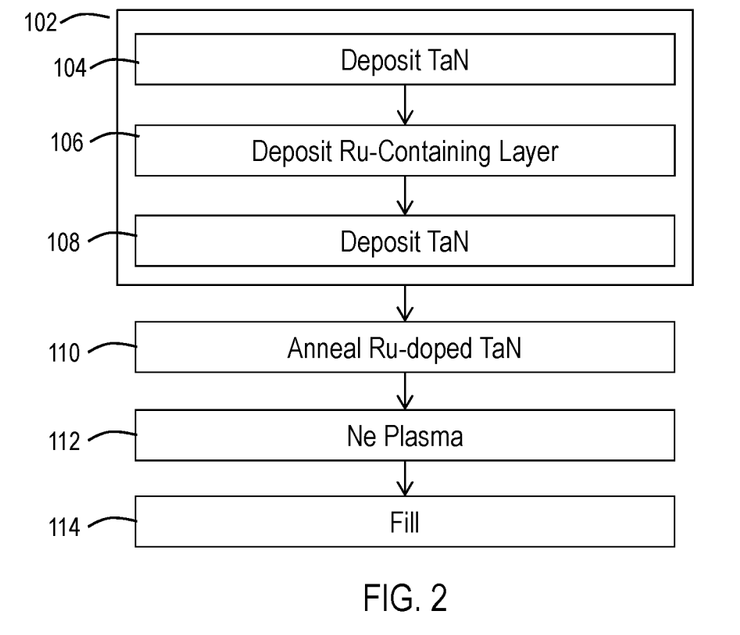
FIG. 2 illustrates a flowchart of a method in accordance with one or more embodiments of the disclosure.

FIG. 2 illustrates an embodiment of a method 100 of forming a copper interconnect according to one or more embodiment of the disclosure. FIGS. 3A through 3E illustrate an electronic device 120 being processed using the method 100 of FIG. 2. The skilled artisan will recognize that the illustrated embodiments are merely exemplary embodiments and the disclosure is not limited to the illustrated process.

Figure 3A:
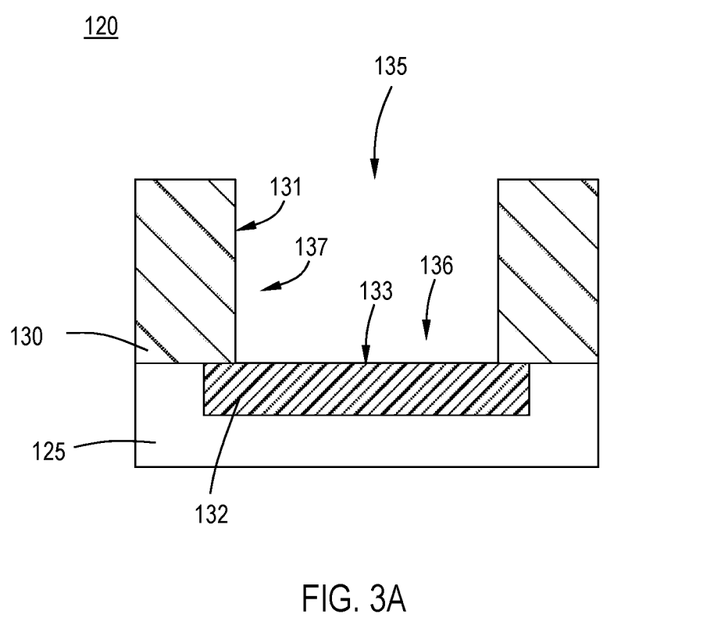
FIGS. 3A through 3E illustrate a schematic representation of an electronic device during execution of the method of FIG. 2.

FIG. 3A illustrates a substrate 125 with a first material 130 and a second material 132 forming a structure 135. The structure 135 illustrated is bound on the sidewalls 137 by the surface 131 of the first material 130 and on the bottom 136 by the top surface 133 of the second material 132.

Figure 3B:
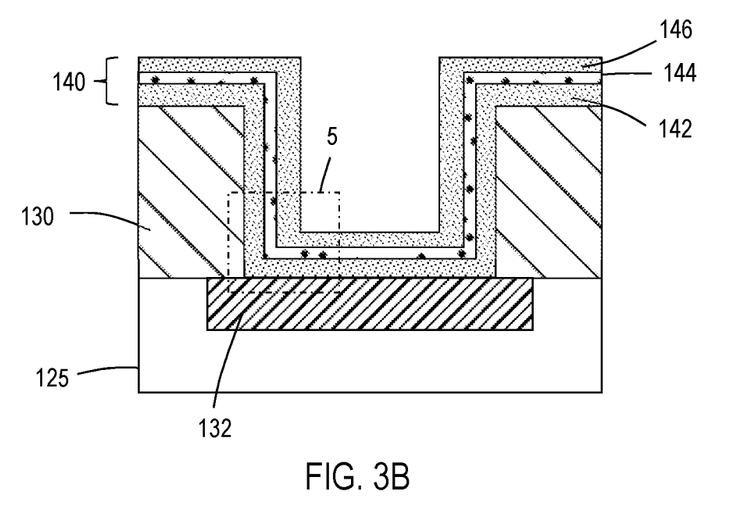
Figure 5A:
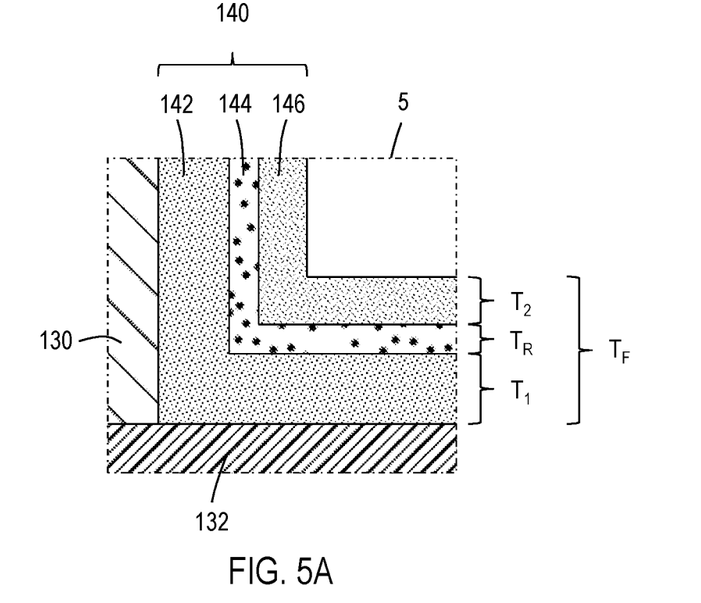
FIGS. 5A and 5B illustrate an expanded view of region 5 of FIG. 3B according to one or more embodiment of the disclosure.
Figure 5B:
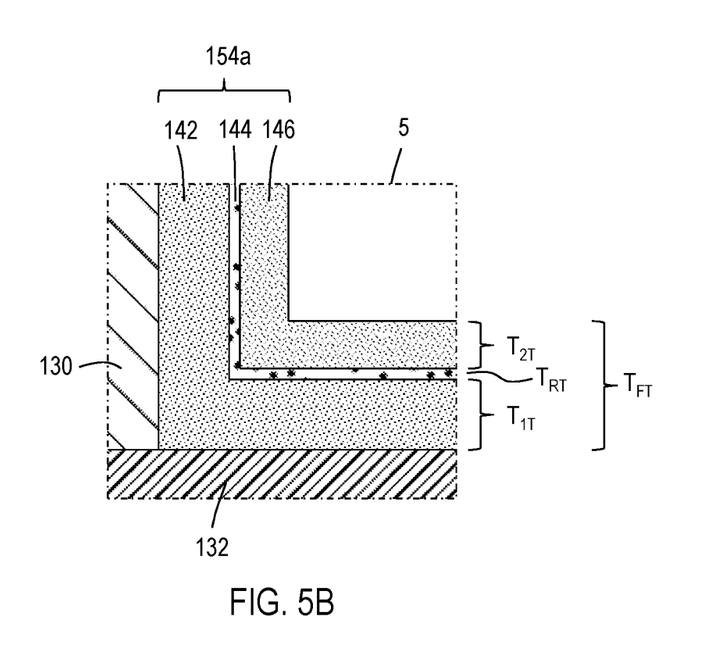

The substrate 125, and any layer formed thereon, is exposed to one or more suitable deposition conditions at process 102 to form a (ruthenium) doped tantalum nitride layer 140, as shown in FIG. 3B. The disclosure describes the Figures and refers to a ruthenium doped film. However, the doped tantalum nitride layer 140 can be doped with ruthenium, tungsten and/or cobalt. The disclosure is not limited to ruthenium doped films and the ruthenium can be replaced with or further includes tungsten and/or cobalt. FIGS. 5A and 5B illustrated an expanded view of region 5 in FIG. 3B in accordance with one or more embodiment of the disclosure. Throughout the text, references to "ruthenium" can be substituted with "cobalt" and/or "tungsten".

The first material 130 can be any suitable material or combination of materials. In some embodiments, the first material 130 comprises a dielectric. Suitable dielectrics include, but are not limited to, silicon oxide, silicon nitride, silicon oxynitride, low-k dielectrics (e.g., porous or carbon-doped $SiO_x$ with k value less than about 5). In some embodiments, the low-k dielectric comprises one or more of fluorine-doped silicon oxide, organosilicate glass or porous silicon dioxide. In other embodiments, the dielectric layer is a multilayer structure. For example, in one or more embodiments, the dielectric layer comprises a stack of oxide and nitride layers.

The doped tantalum nitride layer 140 of some embodiments comprises a lamination of multiple layers. In the embodiment illustrated in FIGS. 2, 3B and 5A, forming the doped tantalum nitride layer 140 is made up of a lamination of a first tantalum nitride layer 142 formed in process 104, a dopant-containing layer 144 formed by process 106 and a second tantalum nitride layer 146 formed by process 108. The dopant of the dopant-containing layer 144 comprises one or more of ruthenium, cobalt or tungsten. References to "ruthenium" throughout this description are substitutable with "tungsten" and/or "cobalt". As used herein, a dopant refers to ruthenium, cobalt and/or tungsten. In some embodiments, forming the doped tantalum nitride layer comprises forming a lamination of tantalum nitride and dopant-containing layers by atomic layer deposition.

In some embodiments, the first tantalum nitride layer 142 is formed to a first layer thickness $T_1$ (as shown in FIG. 5A) by any suitable deposition technique. In an exemplary embodiment, the tantalum nitride layer 142 is formed by atomic layer deposition to a first layer thickness in the range of 5 Å to 10 Å. In some embodiments, the first layer thickness is about 7 Å. In some embodiments, the first layer thickness is greater than or equal to 5 Å, 10 Å, 15 Å or 20 Å, and less than or equal to 40 Å, 35 Å, 30 Å or 25 Å.

The atomic layer deposition of TaN in some embodiments comprises sequential exposures of a tantalum precursor and a nitrogen reactant. The tantalum precursor can be any suitable tantalum species including, but not limited to, pentakis(dimethylamino)tantalum (PDMAT) and the nitrogen reactant comprises ammonia. The skilled artisan will recognize that reactions with PDMAT and $NH_3$ are merely representative of one possible ALD reaction and should not be taken as limiting the scope of the disclosure.

The temperature during the formation of the tantalum nitride layer 142 can be any suitable temperature depending on, for example, the reactive species being used. In some embodiments, the substrate is maintained at a temperature in the range of 200° C. to 350° C., or in the range of 225° C. to 300° C., or in the range of 250° C. to 275° C.

The dopant-containing layer 144 formed by process 106 can be any suitable material. In some embodiments, the dopant-containing layer 144 comprises one or more of metallic ruthenium, metallic tungsten or metallic cobalt. In some embodiments, the ruthenium-containing layer 144 consists essentially of one or more of metallic ruthenium, metallic tungsten or metallic cobalt. As used in this manner, the term "consists essentially of" means that the specified layer is made up of greater than or equal to 95%, 98%, 99% or 99.5% of the stated species on an atomic basis.

In some embodiments, the dopant-containing layer 144 comprises tantalum nitride doped with one or more of ruthenium, tungsten or cobalt. In some embodiments, the tantalum nitride doped with one or more of ruthenium, tungsten or cobalt is formed by flash CVD. In some embodiments, the dopant-containing layer 144 is a thin conformal film deposited by CVD.

In some embodiments, the dopant-containing layer 144 has a pre-treatment thickness $T_R$ (see FIG. 5A) in the range of 0.5 Å to 5 Å, or in the range of about 1 Å to about 2 Å. In some embodiments, the dopant-containing layer 144 is amorphous. In some embodiments, the dopant-containing layer 144 is substantially amorphous. As used in this manner, the term "substantially amorphous" means that greater than 90%, 95% or 98% of the volume of the dopant-containing layer 144 is amorphous. In some embodiments, the dopant-containing layer 144 has a nanocrystallite structure.

In some embodiments, the dopant-containing layer is formed while the substrate is maintained at the same process temperature as during formation of the first tantalum nitride layer 142.

The second tantalum nitride layer 146 deposited by process 108, of some embodiments, is formed by the same process as the first tantalum nitride layer 142. In some embodiments, the second tantalum nitride layer 146 is formed by a different process than that of the first tantalum nitride layer 142. In some embodiments, the second tantalum nitride layer 146 is formed by ALD using PDMAT and ammonia. In some embodiments, the second tantalum nitride layer 146 is formed with the substrate maintained at a temperature in the range of 200° C. to 350° C., or in the range of 225° C. to 300° C., or in the range of 250° C. to 275° C.

The thickness $T_2$ (see FIG. 5A) of the second tantalum nitride layer 146 can be any suitable thickness. In some embodiments, the second thickness of the second tantalum nitride layer 146 is less than, the same as, or greater than the thickness of the first thickness of the first tantalum nitride layer 142. In some embodiments, the second thickness of the second tantalum nitride layer 146 is in the range of 1 Å to 5 Å, or in the range of 2 Å to 4 Å, or about 3 Å. In some embodiments, the second thickness is greater than or equal to 1 Å, 2 Å, 3 Å, 4 Å or 5 Å, and less than or equal to 10 Å, 9 Å, 8 Å, 7 Å or 6 Å.

In some embodiments, the total thickness $T_F$ (see FIG. 5A) of the doped tantalum nitride layer 140 is greater than 5 Å, 7.5 Å, 10 Å, 15 Å or 20 Å. In an exemplary embodiment, the thickness of the (Ru, W and/or Co)-doped TaN layer 140 is in the range of about 10 Å to 15 Å, or in the range of 11 Å to 12 Å.

In some embodiments, the doped tantalum nitride layer 140 comprises at least one tantalum nitride layer and at least one dopant-containing layer. In some embodiments, the doped tantalum nitride layer 140 is deposited as a single layer. For example, in some embodiments, the tantalum nitride layer 140 is formed by ALD or CVD and a dopant precursor is dosed into the reaction.

Figure 3C:
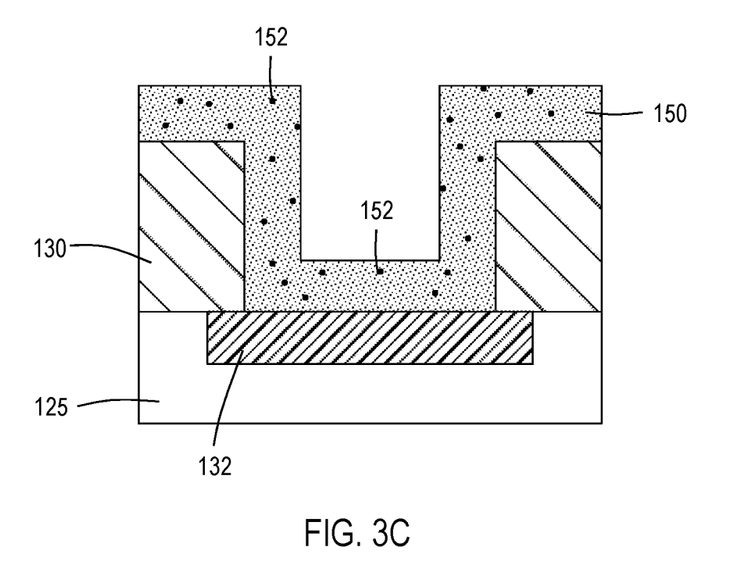
Figure 3D:
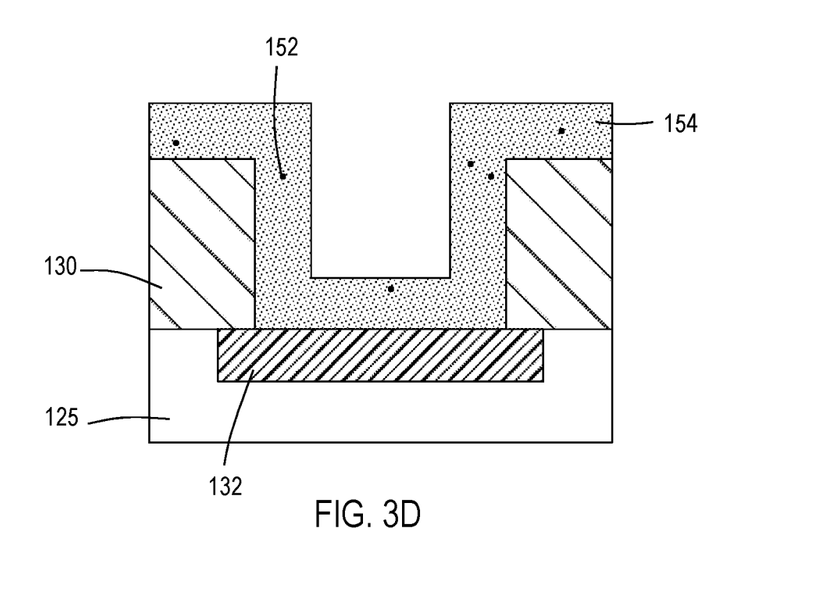

In some embodiments, after formation of the doped tantalum nitride layer 140 lamination, the substrate is annealed in process 110. Annealing the lamination of first tantalum nitride layer 142, dopant-containing layer 144 and second tantalum nitride layer 146 forms an annealed doped tantalum nitride layer 150, as shown in FIG. 3C. For descriptive purposes, dopant atoms 152 are marked with dots in the Figures.

Annealing the lamination can be performed by any suitable technique known to the skilled artisan. In some embodiments, annealing is done at temperatures greater than or equal to 300° C., 400° C., 500° C., 600° C., 700° C., 800° C., 900° C. or 1000° C. In some embodiments, annealing is done in an atmosphere comprising one or more of an inert gas (e.g., molecular nitrogen ($N_2$), argon (Ar)), a reducing gas (e.g., molecular hydrogen ($H_2$) or ammonia ($NH_3$)) or an oxidant (e.g., molecular oxygen ($O_2$), ozone ($O_3$), or peroxides). Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

In some embodiments, as shown in FIG. 3A, the structure 135 in the first material 130 has a bottom 136 and at least one sidewall 137. In some embodiments, the structure 135 is a circular via with one cylindrical sidewall 137. In some embodiments, the structure 135 is a trench with two or more sidewalls 137. In the exemplary embodiment illustrated, the doped tantalum nitride film 150 is a conformal film formed on the sidewalls and bottom of the structure. As used in this manner, a "conformal film" has a thickness that does not vary by more than 0.5%, 1%, 5%, 10% or 15% relative to the average thickness. In some embodiments, each of the layers of the lamination prior to annealing is a conformal film. In some embodiments, the first tantalum nitride layer 142 and second tantalum nitride layer 146 are conformal films.

Referring again to method 100 of FIG. 2, the annealed doped tantalum nitride layer 150 is exposed to a plasma in process 112 to form a treated doped tantalum nitride layer 154. In some embodiments, the annealed doped tantalum nitride layer 150 is an annealed ruthenium-doped tantalum nitride layer, an annealed tungsten-doped tantalum nitride layer and/or an annealed cobalt-doped tantalum nitride layer. In some embodiments, the plasma comprises one or more of helium or neon. In some embodiments, the plasma comprises neon. In some embodiments, the plasma comprises helium.

The plasma exposure process 112, results in a treated doped tantalum nitride layer 154 which has a decreased amount of dopant atoms 152 than the doped tantalum nitride layer 150. In some embodiments, the plasma exposure process 112 results in a treated ruthenium-doped tantalum nitride layer which has a decreased amount of ruthenium atoms than the ruthenium-doped tantalum nitride layer. In some embodiments, the plasma exposure process 112 results in a treated tungsten-doped tantalum nitride layer which has a decreased amount of tungsten atoms than the tungsten-doped tantalum nitride layer. In some embodiments, the plasma exposure process 112 results in a treated cobalt-doped tantalum nitride layer which has a decreased amount of cobalt atoms than the cobalt-doped tantalum nitride layer.

The plasma exposure process 112 causes a decrease in the doping level from a first amount of dopant before the plasma exposure to a second amount of dopant that is less than the first amount of dopant after the plasma exposure. In some embodiments, the plasma exposure process 112 causes a decrease in the ruthenium doping level from a first amount of ruthenium before the plasma exposure to a second amount of ruthenium that is less than the first amount of ruthenium after the plasma exposure. In some embodiments, the plasma exposure process 112 causes a decrease in the tungsten doping level from a first amount of tungsten before the plasma exposure to a second amount of tungsten that is less than the first amount of tungsten after the plasma exposure. In some embodiments, the plasma exposure process 112 causes a decrease in the cobalt doping level from a first amount of cobalt before the plasma exposure to a second amount of cobalt that is less than the first amount of cobalt after the plasma exposure.

In some embodiments, as shown in FIGS. 5A and 5B, the doped tantalum nitride layer 140 is not annealed or maintains a laminate structural appearance with different layers. The adjoining edges of the individual layers may be blur together while keeping a laminate structural appearance. In the illustrated embodiment, exposing the doped tantalum nitride layer 140 to the plasma comprising one or more of helium or neon forms a treated doped tantalum nitride layer 154a with a striated layer structure.

The thickness $T_F$ of the doped tantalum nitride layer 140 of some embodiments changes to a treated thickness $T_{FT}$, as shown in FIG. 5B. The decrease in thickness $T_F$ to treated thickness $T_{FT}$ depends on various factors including, but not limited to, the length of the plasma exposure, power of the plasma exposure, the methods of depositing the individual layers and the composition of the individual layers. In some embodiments, the treated thickness $T_{FT}$ is less than 90%, 80%, 70% or 60% of the thickness $T_F$ prior to plasma exposure.

The thickness of the individual layers may be affected by the plasma exposure to different degrees. In some embodiments, the plasma exposure changes the thickness of the dopant-containing layer 144 and does not substantially change the thickness of the other layers. As used in this manner, the film thickness is not substantially changed if the thickness changes by less than ±5% of the pre-plasma thickness. In some embodiments, the thickness $T_1$ of the first tantalum nitride layer 142 decreases to a treated thickness $T_{1T}$, the thickness $T_2$ of the second tantalum nitride layer 146 decreases to a treated thickness $T_{2T}$, and the thickness $T_R$ of the dopant-containing layer 144 decreases to a treated thickness $T_{RT}$. In some embodiments, one or more of the thickness $T_1$ of the first tantalum nitride layer 142 decreases to a treated thickness $T_{1T}$, the thickness $T_2$ of the second tantalum nitride layer 146 decreases to a treated thickness $T_{2T}$, or the thickness $T_R$ of the dopant-containing layer 144 decreases to a treated thickness $T_{RT}$. In some embodiments, the thickness $T_R$ of the dopant-containing layer 144 is greater than or equal to 2 Å, 3 Å or 4 Å, and is decreased to a treated thickness $T_{RT}$ of less than 1 Å, 2 Å, 3 Å or 4 Å. In some embodiments, the thickness $T_R$ of the dopant-containing layer 144 is greater than 2 Å, 3 Å or 4 Å, and is decreased to a treated thickness $T_{RT}$ of less than 1 Å, 2 Å, 3 Å or 4 Å.

In the embodiment shown in FIGS. 5A and 5B, the plasma exposure process 112, results in a treated doped tantalum nitride layer 154a which has a decreased amount of dopant atoms than the doped tantalum nitride layer 150. The plasma exposure process 112 causes a decrease in the doping level from a first amount of dopant before the plasma exposure to a second amount of dopant that is less than the first amount of dopant after the plasma exposure.

In some embodiments, the concentration of dopant in the doped tantalum nitride layer 140 is in the range of 0.5 to 50 wt. %, or in the range of 1 to 45 wt. %, or in the range of 2 to 40 wt. %, or in the range of 3 to 35 wt. %, or in the range of 4 to 30 wt. %, or in the range of 5 to 25 wt. % of the total weight of the doped tantalum nitride layer 140. In some embodiments, the weight percent of dopant in the doped tantalum nitride layer 140 is decreased to an amount greater than or equal to 0.5%, 1%, 2%, 3%, 4%, 5%, 6%, 7%, 8%, 9% or 10% and is less than or equal to 50%, 45%, 40%, 35%, 30%, 25%, 20% or 15%.

In one or more embodiments, after plasma exposure the concentration of dopant in the treated doped tantalum nitride layer 154, 154a is decreased to an amount in the range of 0.05 to 20 wt. %, or in the range of 0.1 to 15 wt. %, or in the range of 0.2 to 10 wt. %, or in the range of 0.3 to 8 wt. %, or in the range of 0.4 to 6 wt. %, or in the range of 0.5 to 5 wt. % of the total weight of the treated doped tantalum nitride layer 154, 154a. In some embodiments, the weight percent of dopant in the treated doped tantalum nitride layer 154, 154a is decreased to an amount greater than or equal to 0.05%, 0.1%, 0.2%, 0.3%, 0.4%, 0.5%, 0.6%, 0.7%, 0.8%, 0.9%, 1.0%, 1.5%, 2.0%, 2.5%, 3.0%, 3.5%, 4.0%, 4.5% or 5.0% and is less than or equal to 20%, 17.5%, 15%, 12.5%, 10%, 9%, 8%, 7%, 6% or 5%.

The resistivity of the doped tantalum nitride layer 154 is less than the resistivity of both thermal ALD TaN (without dopant) and a doped thermal ALD TaN without helium or neon plasma exposure. In some embodiments, the resistivity of the doped tantalum nitride layer 150 is greater than or equal to 1000 μΩ-cm, 1100 μΩ-cm, 1200 μΩ-cm, 1300 μΩ-cm, 1400 μΩ-cm, 1500 μΩ-cm or 1600 μΩ-cm. In some embodiments, the resistivity of the treated doped tantalum nitride layer 154 is less than or equal to 1000 μΩ-cm, 900 μΩ-cm, 800 μΩ-cm, 700 μΩ-cm, 600 μΩ-cm or 500 μΩ-cm. In some embodiments, helium and/or neon plasma exposure decreases the resistivity of the doped tantalum nitride layer 150 to less than 60%, 50%, 40% or 30% of the pre-plasma (pre-treating) amount. For example, in an exemplary process, the resistivity of the doped tantalum nitride film 150 is decreased from about 1700 μΩ-cm to about 500 μΩ-cm by exposure to a neon plasma.

The doped tantalum nitride film of some embodiments has a pre-plasma carbon content and a post-plasma carbon content. In some embodiments, exposure to the helium or neon plasma reduces the pre-plasma carbon content to the post-plasma carbon content. In some embodiments, the pre-plasma carbon content of the doped tantalum nitride film 150 is greater than 0.8% on an atomic basis. In some embodiments, the post-plasma carbon content of the doped tantalum nitride film 154 is less than 0.6%, 0.5% or 0.4% on an atomic basis. In some embodiments, exposure to the helium or neon plasma reduces the carbon content in the doped tantalum nitride film by greater than or equal to 25%, 30%, 35%, 40%, 45% or 50%.

The plasma can be any suitable plasma. In some embodiments, the helium or neon plasma is an inductively couple plasma (ICP) generated by an ICP coil. ICP coil can run at lower pressure with higher plasma density. In some embodiments, the plasma density of the inductively coupled plasma is greater than or equal to about $10^{11}$ cm$^{-3}$, $10^{12}$ cm$^{-3}$ or $10^{13}$ cm$^{-3}$, or greater than or equal to the recited order of magnitude. In some embodiments, the plasma generated by ICP coil has a frequency of 2 MHz. In some embodiments, the RF source power may be supplied between about 500 watts and about 25 kW at a frequency between about 400 kHz and about 60 MHz. A RF bias power may be applied to the substrate support at up to about 3000 watts at a frequency at 13.56 MHz or 2 MHz. In some embodiments, the RF source power may be supplied at the gas mixture between about 100 watts and about 3000 watts and at a frequency between about 400 kHz and about 60 MHz. Dual frequency or triple frequency might be used to modulate ion energy in certain cases. The DC bias power may be applied to the collimator between about 1 kW and about 10 kW in a pulsed mode. Alternatively, the DC bias power may be applied to the collimator in a continuous mode. In some embodiments, the plasma pressure is in the range of 0.1 mTorr to 100 mTorr. In some embodiments, the substrate is maintained a temperature in the range of −20° C. to 400° C.

Figure 3E:
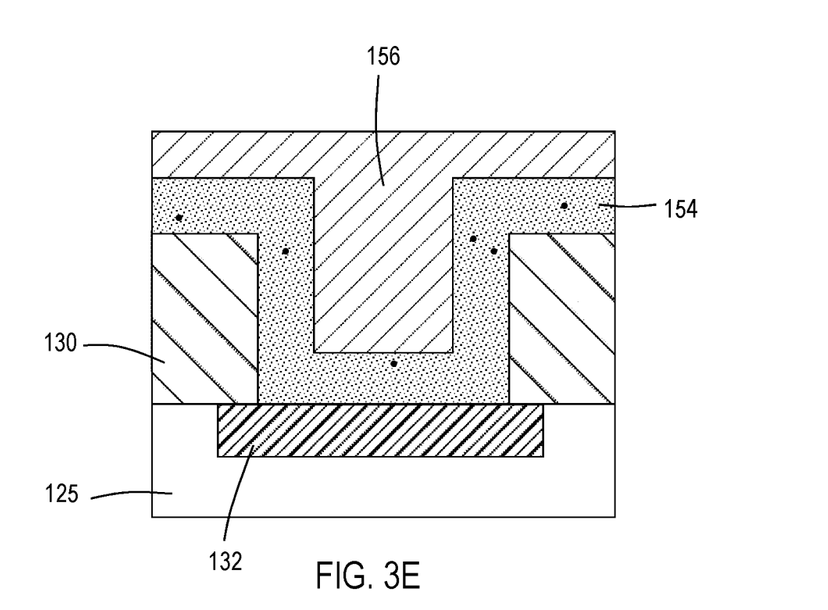

Referring again to method 100 of FIG. 2, in some embodiments a metal film 156 is deposited on the treated tantalum nitride layer 154 in process 114 to fill the structure, as shown in FIG. 3E. In some embodiments, the metal film 156 is a metal contact. In some embodiments, the metal film 156 comprises or consists essentially of one or more of copper (Cu), cobalt (Co), or copper doped with one or more of manganese (Mn), tungsten (W) or aluminum (Al).

The metal film 156 can be deposited by any suitable technique known to the skilled artisan. In some embodiments, the metal film 156 is deposited by atomic layer deposition, chemical vapor deposition or physical vapor deposition.

Figure 4:
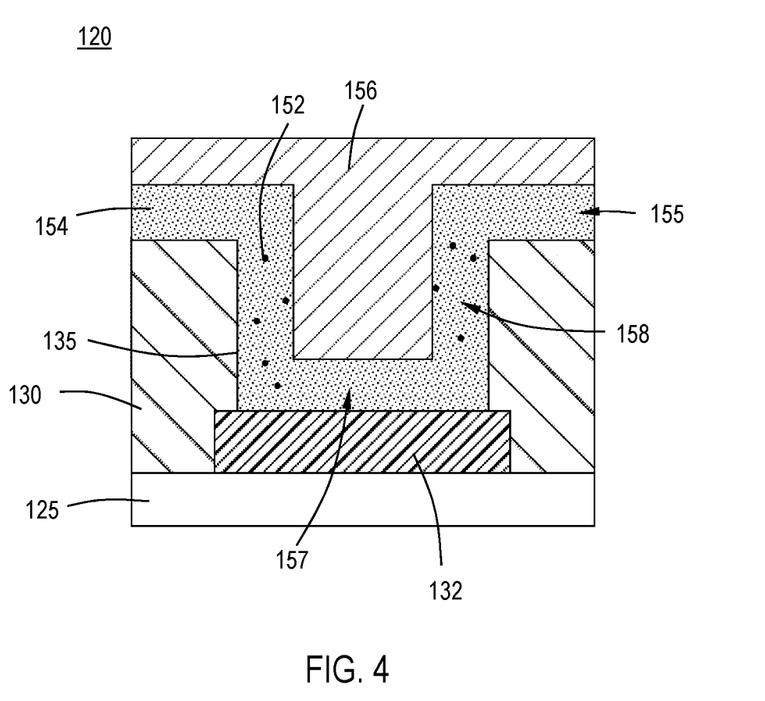
FIG. 4 illustrates a schematic representation of an electronic device according to one or more embodiment of the disclosure.

FIG. 4 shows another electronic device 120 according to one or more embodiment of the disclosure. The structure 135 in FIG. 4 is bounded on the sides by the first material 130 and on the bottom by a second material 132. In some embodiments, the first material 130 comprises a dielectric and the second material 132 comprises a conductive material. In some embodiments, the conductive material comprises a copper layer. In some embodiments, the first material 130 comprises a low-k dielectric material.

In some embodiment, the doped tantalum nitride film 150 is deposited as a conformal film with a first amount of dopant. In the illustrated embodiment, the substrate 125 is biased to form a directional plasma during the plasma exposure process 112. Biasing the substrate 125 causes the ions in the neon plasma to move toward the substrate surface resulting in a different removal pattern for the dopant atoms 152 than would be observed without the bias applied to the substrate.

In some embodiments, as shown in FIG. 4, the directional plasma removes the dopant 152 from the tantalum nitride on the bottom 157 of the structure 135 and leaves substantially all of the dopant in the tantalum nitride on the sidewalls 158. As used in this manner, the term "substantially all" means that greater than or equal to about 85%, 90%, 95% or more of the original dopant atoms in the sidewall of the tantalum nitride film, below the top surface of the first material 130, remains. In the illustrated embodiment, the dopant is also removed from the tantalum nitride top 155 of the conformal film.

Various hardware arrangements can be used to implement the method 100. In some embodiments, deposition of the tantalum nitride films, plasma exposure and annealing occur in the same process chamber. In some embodiments, the deposition, annealing and plasma exposure occur in separate process chambers.

Figure 6:
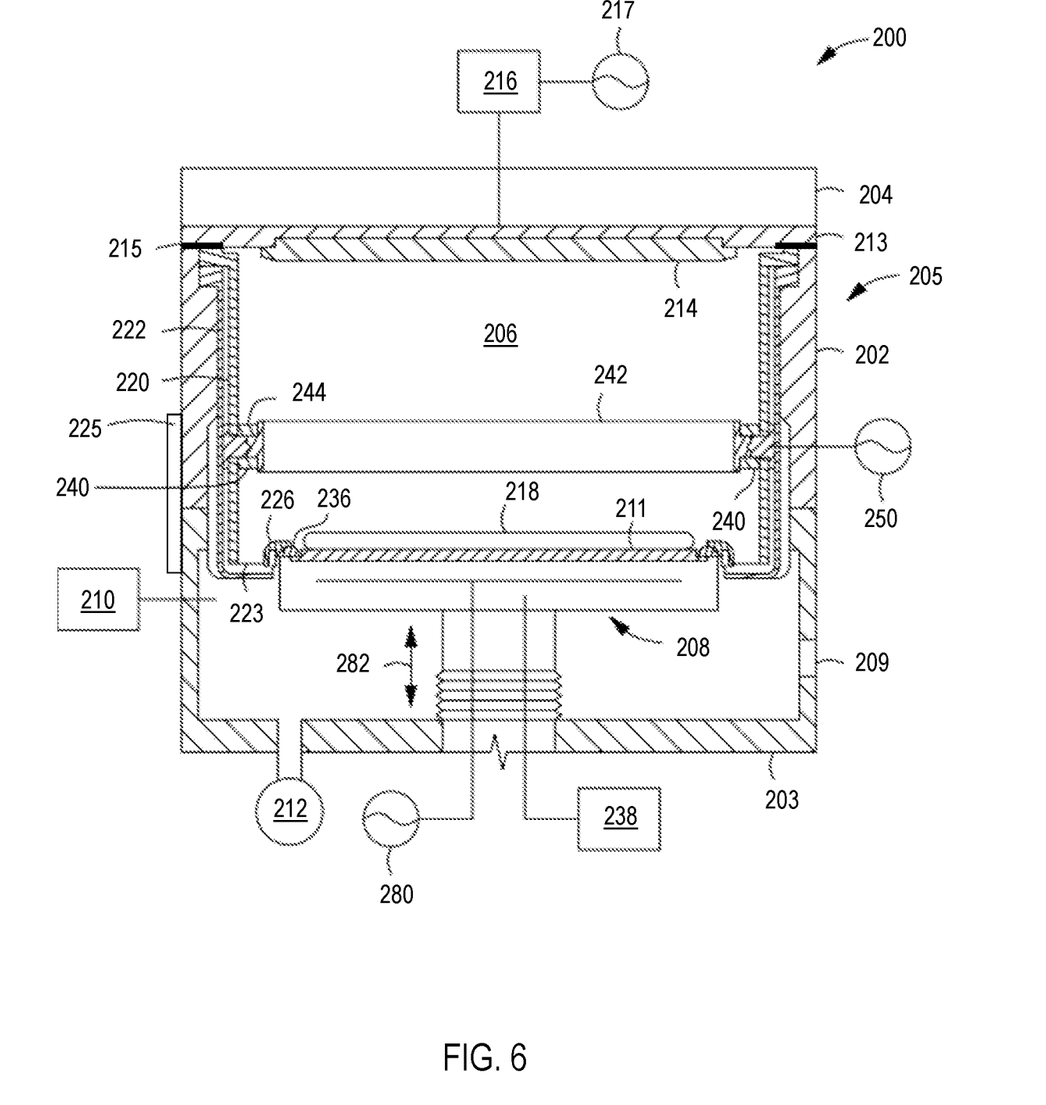
FIG. 6 illustrates a schematic diagram of a processing tool according to one or more embodiments of the disclosure.

FIG. 6 depicts a schematic, cross-sectional view of an illustrative processing chamber 200 (e.g., a PVD chamber) in accordance with some embodiments of the present disclosure. Examples of suitable PVD chambers include the ENCORE® II and ENCORE® III as well as other PVD processing chambers, commercially available from Applied Materials, Inc., Santa Clara, of California. However, the methods disclosed may also be used in processing chambers available from other manufacturers. In one embodiment, the process chamber 200 is capable of depositing, for example metals, metal nitrides, metal fluorides, metal carbides, and the like, on a substrate 218.

The process chamber 200 has a chamber body 205 that includes sidewalls 202, a bottom 203, and a lid assembly 204 all of which enclose an interior volume 206. A substrate support 208 is disposed in a lower portion of the interior volume 206 of the process chamber 200 opposite a target 214. A substrate transfer port 209 is formed in the sidewalls 202 for transferring substrates into and out of the interior volume 206.

A gas source 210 is coupled to the process chamber 200 to supply process gases into the interior volume 206. In one embodiment, process gases may include inert gases, non-reactive gases, and reactive gases, etc. Examples of process gases that may be provided by the gas source 210 include, but not limited to, argon gas (Ar), helium (He), neon gas (Ne), nitrogen gas ($N_2$), oxygen gas ($O_2$), hydrogen gas ($H_2$), and $H_2O$ among others.

A pump 212 is coupled to the process chamber 200 in communication with the interior volume 206 to control the pressure of the interior volume 206. In one embodiment, the pressure of the process chamber 200 may be maintained at greater than zero pressure to about 10 mTorr or less. In another embodiment, the pressure within the process chamber 200 may be maintained at about 3 mTorr.

A backing plate 213 may support the target 214 in an upper portion of the interior volume 206. The backing plate 213 may be electrically isolated from the sidewalls 202 by an isolator 215. The target 214 generally provides a source of material which will be deposited on the substrate 218. The target 214 may be fabricated from a material containing titanium (Ti) metal, tantalum metal (Ta), niobium (Nb) metal, tungsten (W) metal, cobalt (Co), nickel (Ni), copper (Cu), aluminum (Al), manganese (Mn), alloys thereof, combinations thereof, or the like. In an exemplary embodiment depicted herein, the target 214 may be fabricated with cobalt metal (Co).

The target 214 may be coupled to a source assembly 216 comprising a power supply 217 for the target 214. In some embodiments, the power supply 217 may be an RF generator. In some embodiments, the power supply 217 may alternatively be a DC source power supply. In some embodiments, the power supply 217 may include both DC and RF power sources.

An additional RF power source 280 may also be coupled to the process chamber 200 through the substrate support 208 to provide a bias power between the target 214 and the substrate support 208. In one embodiment, the RF power source 280 may provide power to the substrate support 208 to bias the substrate 218 at a frequency between about 1 MHz and about 100 MHz, such as about 13.56 MHz.

The substrate support 208 may be moveable between a raised position and a lowered position, as shown by arrow 282. In the lowered position, a support surface 211 of the substrate support 208 may be aligned with or just below the substrate transfer port 209 to facilitate entry and removal of the substrate 218 to and from the process chamber 200. The support surface 211 may have an edge deposition ring 236 sized to receive the substrate 218 thereon while protecting the substrate support 208 from plasma and deposited material. The substrate support 208 may be moved to the raised position closer to the target 214 for processing the substrate 218 in the process chamber 200. A cover ring 226 may engage the edge deposition ring 236 when the substrate support 208 is in the raised position. The cover ring 226 may prevent deposition material from bridging between the substrate 218 and the substrate support 208. When the substrate support 208 is in the lowered position, the cover ring 226 is suspended above the substrate support 208 and substrate 218 positioned thereon to allow for substrate transfer.

During substrate transfer to/from the process chamber 200, a robot blade (not shown) having the substrate 218 thereon is extended through the substrate transfer port 209. Lift pins (not shown) extend through the support surface 211 of the substrate support 208 to lift the substrate 218 from the support surface 211 of the substrate support 208, thus allowing space for the robot blade to pass between the substrate 218 and substrate support 208. The robot may then carry the substrate 218 into or out of the process chamber 200 through the substrate transfer port 209. Raising and lowering of the substrate support 208 and/or the lift pins may be controlled by a controller 298.

During sputter deposition, the temperature of the substrate 218 may be controlled by utilizing a thermal controller 238 disposed in the substrate support 208. The substrate 218 may be optionally heated to a desired temperature for processing. In some embodiments, the optional heating can be used to bring the substrate and/or film temperature to a temperature of about 200 to about 400 degrees Celsius. In other embodiments, the substrate may be processed at room temperature (about 15 degrees Celsius to about 30 degrees Celsius). In other embodiments the temperature is in a range of about 15 degrees to about 400 degrees Celsius. After processing, the substrate 218 may be rapidly cooled utilizing the thermal controller 238 disposed in the substrate support 208. The thermal controller 238 controls the temperature of the substrate 218, and may be utilized to change the temperature of the substrate 218 from a first temperature to a second temperature in a matter of seconds to about a minute.

An inner shield 220 may be positioned in the interior volume 206 between the target 214 and the substrate support 208. The inner shield 220 may be formed of aluminum or stainless steel among other materials. In one embodiment, the inner shield 220 is formed from stainless steel. An outer shield 222 may be formed between the inner shield 220 and the sidewall 202. The outer shield 222 may be formed from aluminum or stainless steel among other materials. The outer shield 222 may extend past the inner shield 220 and is configured to support the cover ring 226 when the substrate support 208 is in the lowered position.

In one embodiment, the inner shield 220 includes a radial flange 223 that includes an inner diameter that is greater than an outer diameter of the inner shield 220. The radial flange 223 extends from the inner shield 220 at an angle greater than about ninety degrees (90°) relative to the inside diameter surface of the inner shield 220. The radial flange 223 may be a circular ridge extending from the surface of the inner shield 220 and is generally adapted to mate with a recess formed in the cover ring 226 disposed on the substrate support 208. The recessed may be a circular groove formed in the cover ring 226 which centers the cover ring 226 with respect to the longitudinal axis of the substrate support 208.

In some embodiments, the process chamber 200 may include an inductive coil 242. The inductive coil 242 of the process chamber 200 may have one turn or more than one turn. The inductive coil 242 may be just inside the inner shield 220 and positioned above the substrate support 208. The inductive coil 242 may be positioned nearer to the substrate support 208 than the target 214. The inductive coil 242 may be formed from a material similar or equal in composition to the target 214, such as, for example, cobalt, to act as a secondary sputtering target. The inductive coil 242 is supported from the inner shield 220 by a plurality of coil spacers 240. The coil spacers 240 may electrically isolated the inductive coil 242 from the inner shield 220 and other chamber components and to protect from being sputtered on to avoid shorting or creating an unwanted plasma excitation source.

The inductive coil 242 may be coupled to a power source 250. The power source 250 may have electrical leads which penetrate the sidewall 202 of the process chamber 200, the outer shield 222, the inner shield 220 and the coil spacers 240. The electrical leads connect to an electrical hub 244 on the inductive coil 242 for providing power to the inductive coil 242. The electrical hub 244 may have a plurality of insulated electrical connections for providing power to the inductive coil 242. Additionally, the electrical hubs 244 may be configured to interface with the coil spacers 240 and support the inductive coil 242. The power source 250, in one embodiment, applies current to the inductive coil 242 to induce an RF field within the process chamber 200 and couple power to the plasma for increasing the plasma density, i.e., concentration of reactive ions. In some embodiments, the inductive coil 242 is operated at an RF power frequency less than the RF power frequency of the RF power source 280. In one embodiment, the RF power frequency supplied to the inductive coil 242 is about 2 MHz. In other embodiments the RF power frequency may operate in a range of about 1.8 MHz to about 2.2 MHz. In other embodiments, the RF power frequency may range from about 0.1 MHz to 99 MHz. In some embodiments, the inductive coil 242 is made of a material, such as a metal material, that can be sputtered onto a substrate. The power source 250 may then also apply DC power to the inductive coil 242 to enable sputtering of the inductive coil 242 while coupling RF power to the plasma.

A controller (not shown) is coupled to the process chamber 200. The controller includes a central processing unit (CPU), a memory, and support circuits. The controller is utilized to control the process sequence, regulating the gas flows from the gas source 210 into the process chamber 200 and controlling ion bombardment of the target 214 and the inductive coil 242. In one embodiment, the controller adjusts a first RF power level of a first power supply (e.g., RF power source 280), a second RF power level of a second power supply (e.g., power source 250), a first DC power level of the second power supply (e.g., power source 250), and a second DC power level of a third power supply (e.g., power supply 217) while sputtering the target and/or inductive coil and while regulating a flow of an etching gas into the interior volume 206 of the process chamber 200. Additional aspects of the controller are described below.

Figure 7:
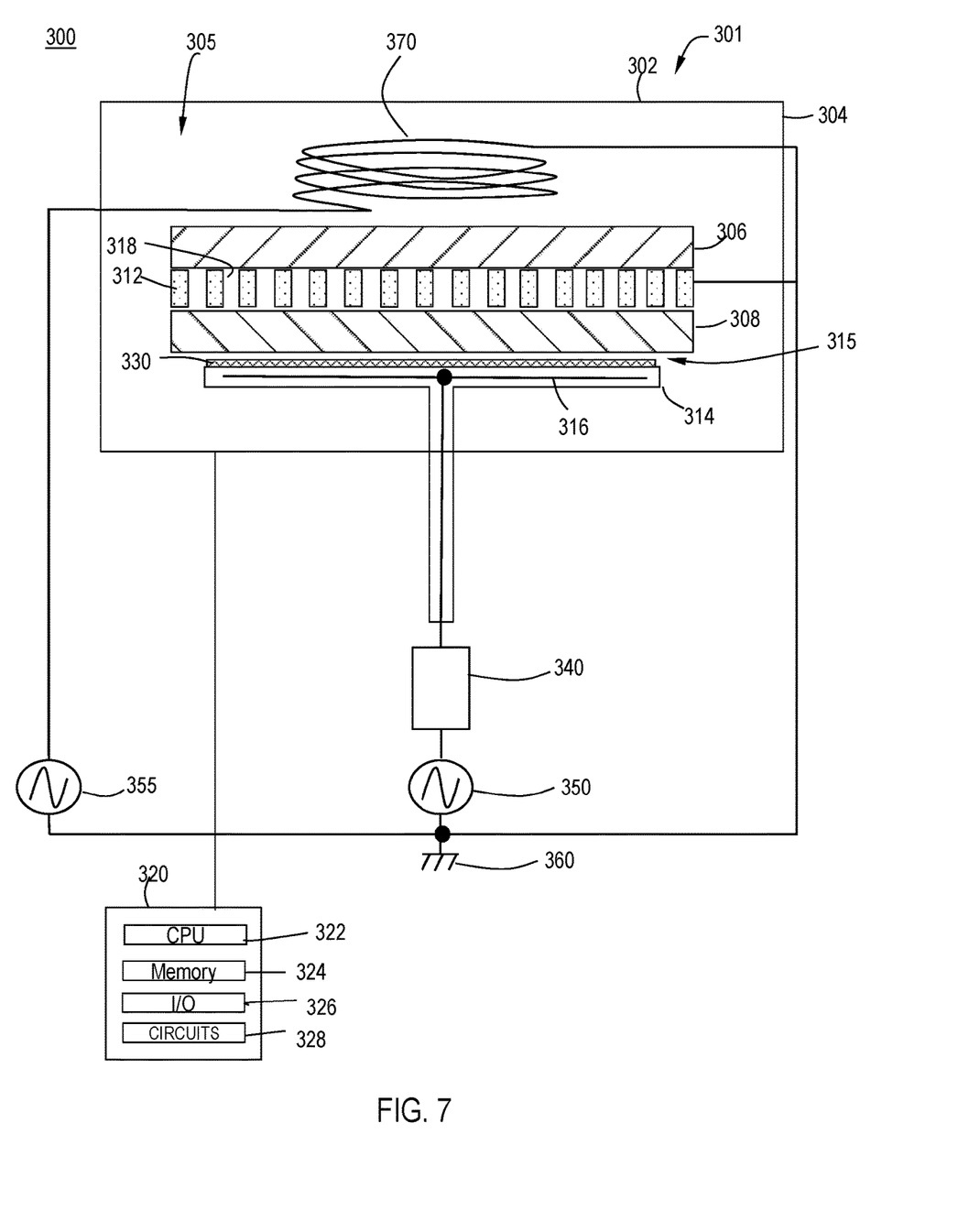
FIG. 7 illustrates a schematic diagram of a processing tool according to one or more embodiments of the disclosure.

FIG. 7 illustrates a processing tool 300 according to one or more embodiments. In one or more embodiments, the processing tool 300 comprises a processing chamber 301. The processing chamber comprises a lid 302 and at least one side wall 304. In one or more embodiments, the lid 302 and the at least one sidewall 304 define an internal volume 305 of the processing chamber 301. In one or more embodiments, the processing tool 300 comprises a remote plasma unit 306 within the internal volume 305 of the processing chamber 301. In one or more embodiments, a direct plasma unit 308 is within the internal volume 305 of the processing chamber 301. In one or more embodiments, one of the remote plasma unit 306 generates a remote plasma and the direct plasma unit 308 generates a direct plasma. In one or more embodiments, the generation of the remote plasma and the generation of the direct plasma occurs sequentially. In some embodiments, the generation of the remote plasma occurs first, and the generation of the direct plasma occurs thereafter. In other embodiments, the generation of the direct plasma occurs first and the generation of the remote plasma occurs thereafter. In one or more embodiments, the generation of the remote plasma and the generation of the direct plasma occur simultaneously.

In one or more embodiments, an ion filter 312 separates the remote plasma unit 306 and the direct plasma unit 308. In one or more embodiments, the ion filter 312 is used to filter ions from the plasma effluents during transit from the remote plasma unit 306 to the substrate processing region 315. In one or more embodiments, the ion filter 312 functions to reduce or eliminate ionically charged species traveling from the remote plasma unit 306 to the substrate 330. In one or more embodiments, uncharged neutral and radical species may pass through at least one aperture 318 in the ion filter 312 to react at the substrate 330. It should be noted that complete elimination of ionically charged species in the reaction region 315 surrounding the substrate 330 is not always the desired goal. In one or more embodiments, ionic species are required to reach the substrate 330 in order to perform etch and/or deposition processes. In these instances, the ion filter 312 helps control the concentration of ionic species in the reaction region 315 at a level that assists the treat/clean and/or deposition process. In one or more embodiments, the ion filter 312 comprises a showerhead.

In one or more embodiments, the processing tool comprises at least one electrode within the processing chamber. In one or more embodiments, the at least one electrode is located within the internal volume 305 of the processing chamber 301. In the embodiment illustrated in FIG. 6, at least one electrode 316 is positioned in electrical communication with the pedestal 314.

In one or more embodiments, the processing chamber 301 comprises a pedestal 314. In one or more embodiments, the pedestal 314 is configured to support a semiconductor substrate 330 in a processing region 315. In one or more embodiments, the pedestal 314 may have a heat exchange channel (not illustrated) through which a heat exchange fluid flows to control the temperature of the substrate 330. In one or more embodiments, the substrate 330 temperature can be cooled or heated to maintain relatively low temperatures, such as from about −20° C. to about 400° C., or from about 0° C. to about 400° C. In one or more embodiments, the heat exchange fluid comprises one or more of ethylene glycol or water. In other embodiments, the pedestal 314 is resistively heated in order to achieve relatively high temperatures, such as from about 100° C. to about 1100° C., or from about 200° C. to about 750° C., through the use of an embedded resistive heater element (not illustrated). In one or more embodiments, the pedestal 314 is configured to rotate. In one or more embodiments, the pedestal 314 comprises an electrode 316 within the interior of the pedestal 314, and the pedestal 314 is powered by RF generator 350 and matched by RF match 340. In one or more embodiments, the pedestal 314 is comprised of a metallic material and is, itself, an electrode. The electrode 316 can be polarized to bias the substrate or substrate support and form a directional plasma.

In one or more embodiments, at least one power source, e.g. RF generator, 350 is electrically connected via an RF match 340 to the processing chamber 301.

In one or more embodiments, two RF generators are electrically connected to the processing chamber 301. In such embodiments, a first RF generator 350 is electrically connected to a pedestal electrode 316, and a second RF generator 355 is electrically connected to an inductively coupled plasma (ICP) coil 370.

In one or more embodiments, a plasma is generated using a radio frequency (RF) powered remote plasma unit 306 and direct plasma unit 308. In one or more embodiments, alternating current (AC) power is rectified and switched to provide current to a RF amplifier. The RF amplifier operates at a reference frequency (13.56 MHz, for example), drives current through an output-matching network, and then through a power measurement circuit to the output of the power supply. The output match is usually designed to be connected a generator that is optimized to drive particular impedance, such as, for example, 50 ohms, in order to have the same characteristic impedance as the coaxial cables commonly used in the industry. Power flows through the matched cable sections, is measured by the match controller, and is transformed through the load match. The load match is usually a motorized automatic tuner, so the load match operation incurs a predetermined time delay before the system is properly configured. After passing through the load match, power is then channeled into a plasma excitation circuit that drives two electrodes in an evacuated processing chamber. A processing gas is introduced into the evacuated processing chamber, and when driven by the circuit, plasma is generated. Since the matching network or the load match is motorized, the response time from the matching network is typically on the order of one second or more.

In some embodiments, the plasma power is in a range of about 10 W to about 1000 W, including from about 200 W to about 600 W. In some embodiments, the plasma power is less than or equal to about 1000 W, or less than or equal to about 6500 W.

The plasma frequency may be any suitable frequency. In some embodiments, the plasma has a frequency in a range of about 200 kHz to 30 MHz. In some embodiments, the plasma frequency is less than or equal to about 20 MHz, less than or equal to about 10 MHz, less than or equal to about 5 MHz, less than or equal to about 1000 kHz, or less than or equal to about 500 kHz. In some embodiments, the plasma frequency is greater than or equal to about 210 kHz, greater than or equal to about 250 kHz, greater than or equal to about 600 kHz, greater than or equal to about 750 MHz, greater than or equal to about 1200 kHz, greater than or equal to about 2 MHz, greater than or equal to about 4 MHz, greater than or equal to about 7 MHz, greater than or equal to about 12 MHz, greater than or equal to about 15 MHz, or greater than or equal to about 25 MHz. In one or more embodiments, the plasma has a frequency of about 13.56 MHz, or about 350 kHz, or about 400 kHz, or about 27 MHz, or about 40 MHz, or about 60 MHz.

In one or more embodiments, a controller 320 may be provided and coupled to various components of the processing tool 300 to control the operation thereof. The controller 320 can be a single controller that controls the entire processing tool 300, or multiple controllers that control individual portions of the processing tool 300. For example, the processing tool 300 may include separate controllers for each of the processing chamber 301, remote plasma unit 306, direct plasma unit 308, and power source (e.g., RF generator 350).

In some embodiments, the processing chamber 301 further comprises a controller 320. In one or more embodiments, the controller 320 controls the ignition of the plasma by the remote plasma unit 306 and/or the direct plasma unit 308 within the processing chamber 301.

In some embodiments, the controller 320 includes a central processing unit (CPU) 322, a memory 324, inputs/outputs (I/O) 326, and support circuits 328. The controller 320 may control the processing tool 300 directly, or via computers (or controllers) associated with particular process chamber and/or support system components.

The controller 320 may be one of any form of general-purpose computer processor that can be used in an industrial setting for controlling various chambers and sub-processors. The memory 324 or computer readable medium of the controller 320 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 324 can retain an instruction set that is operable by the processor (CPU 322) to control parameters and components of the processing tool 300.

The support circuits 328 are coupled to the CPU 322 for supporting the processor in a conventional manner. These circuits include cache, power supplies, clock circuits, input/output circuitry and subsystems, and the like. One or more processes may be stored in the memory 324 as software routine that, when executed or invoked by the processor, causes the processor to control the operation of the processing tool 300 or individual processing units (e.g. remote plasma unit 306 and direct plasma unit 308) in the manner described herein. The software routine may also be stored and/or executed by a second CPU (not shown) that is remotely located from the hardware being controlled by the CPU 322.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 320 has one or more configurations to execute individual processes or sub-processes to perform the method. The controller 320 can be connected to and configured to operate intermediate components to perform the functions of the methods. For example, the controller 320 can be connected to and configured to control one or more of the remote plasma unit 306, the direct plasma unit 308, the pedestal 314, the at least one electrode 316, the ICP coil 370, or other components.

Additional embodiments of the disclosure are directed to a processing system having one or more processing chambers. In one or more embodiments, the processing chamber including a processing tool of either FIG. 5 or FIG. 6.

Additional embodiments of the disclosure are directed to processing tools for the formation of the memory devices and methods described, as shown in FIG. 7. The cluster tool 900 includes at least one central transfer station 921, 931 with a plurality of sides. A robot 925, 935 is positioned within the central transfer station 921, 931 and is configured to move a robot blade and a wafer to each of the plurality of sides.

Figure 8:
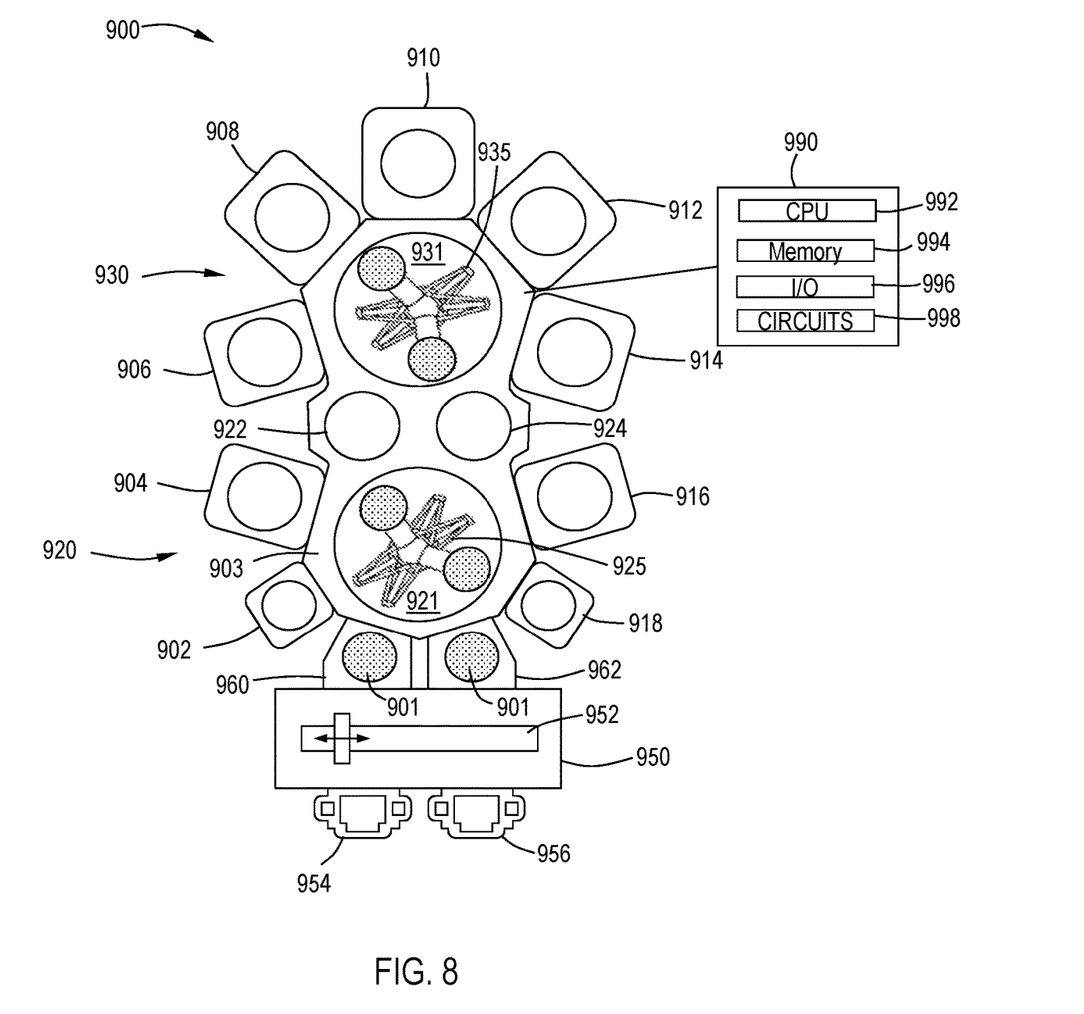
FIG. 8 illustrates a schematic diagram of a cluster tool according to one or more embodiment of the disclosure.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective etching chamber, and the like. The particular arrangement of process chambers and components can be varied depending on the cluster tool and should not be taken as limiting the scope of the disclosure.

In the embodiment shown in FIG. 8, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock chamber 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU), memory, suitable circuits and storage.

Accordingly, one or more embodiments of the disclosure are directed to cluster tools comprising one or more process chambers around a central transfer station. The one or more process chambers of some embodiments are configured to deposit a ruthenium doped tantalum nitride film, anneal the ruthenium doped tantalum nitride film and expose the annealed tantalum nitride film to a neon plasma. At least one controller is connected to the one or more process chambers and central transfer station. The at least one controller of some embodiments has one or more configurations selected from: a configuration to deposit a tantalum nitride film; a configuration to deposit a ruthenium-containing film; a configuration to anneal a substrate; a configuration to move the substrate between the one or more process chambers and central transfer station; and a configuration to expose the substrate to a neon plasma.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Additional embodiments of the disclosure are directed to non-transitory computer readable medium including instructions, that, when executed by a controller of a processing chamber, causes the processing chamber to perform the operations of: depositing a tantalum nitride film on a substrate; depositing a ruthenium-containing film on the substrate; annealing the substrate; and exposing the substrate to a neon plasma.

One or more embodiments are directed to a non-transitory computer readable medium including instructions, that, when executed by a controller of a processing chamber, cause the processing chamber to perform the operations of exposing a substrate comprising a surface structure with a metal bottom, dielectric sidewalls, and a field of dielectric to a dual plasma treatment in a processing chamber to remove chemical residual and/or impurities from the metal bottom, the dielectric sidewalls, and/or the field of the dielectric and/or repair surface defects in the dielectric sidewalls and/or the field of the dielectric; wherein the dual plasma treatment comprises a direct plasma followed by a remote plasma.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing method comprising:
   forming a doped tantalum nitride layer on a substrate, the doped tantalum nitride layer having a first amount of dopant comprising one or more of ruthenium, tungsten or cobalt, the substrate having a surface with a structure formed therein, the structure extending a distance into the substrate and having sidewalls and a bottom;
   exposing the doped tantalum nitride layer to a plasma comprising one or more of helium or neon to form a treated doped tantalum nitride layer with a resistivity less than 600 μΩ-cm and a second amount of dopant less than the first amount of dopant; and
   depositing a metal film on the treated doped tantalum nitride layer to fill the structure.

2. The method of claim 1, wherein the first amount of dopant is in the range of 0.5 to 50 wt. % of the doped tantalum nitride layer.

3. The method of claim 2, wherein the second amount of dopant is decreased from the first amount of dopant and is in the range of 0.05 to 20 wt. % of the treated doped tantalum nitride layer.

4. The method of claim 1, wherein forming the doped tantalum nitride layer comprises forming a lamination of tantalum nitride and dopant-containing layers by atomic layer deposition, and then annealing the lamination.

5. The method of claim 1, wherein the doped tantalum nitride layer has a resistivity greater than 1200 μΩ-cm.

6. The method of claim 1, wherein the doped tantalum nitride layer has a carbon content greater than 0.8% on an atomic basis.

7. The method of claim 6, wherein the treated doped tantalum nitride layer has a carbon content to less than 0.6% on an atomic basis.

8. The method of claim 1, wherein the plasma is an inductively coupled plasma, generated by an ICP coil.

9. The method of claim 8, wherein the plasma generated by the ICP coil has a frequency of 2 MHz.

10. The method of claim 1, wherein the substrate is biased to create a directional plasma.

11. The method of claim 1, wherein the metal film is a metal contact.

12. The method of claim 11, wherein the metal contact comprises one or more of copper, cobalt or copper doped with one or more of manganese, tungsten or aluminum.

13. The method of claim 1, wherein, the bottom comprises a copper layer.

14. The method of claim 13, wherein the sidewalls of the structure comprise a low-k dielectric material.

15. The method of claim 14, wherein the low-k dielectric material comprises one or more of fluorine-doped silicon oxide, organosilicate glass or porous silicon dioxide.

16. The method of claim 15, wherein the doped tantalum nitride layer is a conformal film formed on the sidewalls and bottom of the structure.

17. The method of claim 16, wherein the substrate is biased to form a directional plasma, the directional plasma removing the dopant from the tantalum nitride on the bottom of the structure and leaving substantially all of the dopant in the tantalum nitride on the sidewalls.

18. A processing method comprising:
   forming a doped tantalum nitride layer on a substrate, the doped tantalum nitride layer having a first amount of dopant in the range of 0.5 to 50 wt. % of the doped tantalum nitride layer, the dopant comprising one or more of ruthenium, tungsten or cobalt, the substrate having a surface with a structure formed therein, the structure extending a distance into the substrate and having sidewalls and a bottom;
   exposing the doped tantalum nitride layer to a plasma comprising one or more of helium or neon to form a treated doped tantalum nitride layer with a second amount of dopant less than the first amount of dopant, the second amount of dopant in the range of 0.05 to 20 wt. % of the treated doped tantalum nitride layer; and
   depositing a metal film on the treated doped tantalum nitride layer to fill the structure.

19. The method of claim 18, wherein the doped tantalum nitride layer has a resistivity greater than 1200 μΩ-cm and the treated doped tantalum nitride layer has a resistivity less than 600 μΩ-cm.

20. A non-transitory computer readable medium including instructions, that, when executed by a controller of a processing chamber, causes the processing chamber to perform operations of:
   forming a doped tantalum nitride layer on a substrate having a surface with a structure formed therein, the structure extending a distance into the substrate and having sidewalls and a bottom, the doped tantalum nitride layer having a first amount of dopant comprising one or more of ruthenium, tungsten or cobalt;
   exposing the doped tantalum nitride layer to a plasma comprising one or more of helium or neon to form a treated doped tantalum nitride layer with a resistivity less than 600 μΩ-cm and a second amount of dopant less than the first amount of dopant; and
   depositing a metal film on the treated doped tantalum nitride layer to fill the structure,
   wherein the substrate is biased to form a directional plasma, the directional plasma removing the dopant from the tantalum nitride on the bottom of the structure and leaving substantially all of the dopant in the tantalum nitride on the sidewalls.

* * * * *

UNITED STATES PATENT AND TRADEMARK OFFICE
CERTIFICATE OF CORRECTION

| | | |
|---|---|---|
| PATENT NO. | : 12,243,774 B2 | Page 1 of 1 |
| APPLICATION NO. | : 17/853150 | |
| DATED | : March 4, 2025 | |
| INVENTOR(S) | : Rui Li et al. | |

It is certified that error appears in the above-identified patent and that said Letters Patent is hereby corrected as shown below:

On the Title Page

Item (74), under "Attorney, Agent, or Firm", replace "Servilia" with "Servilla".

Signed and Sealed this
Fifteenth Day of April, 2025

Coke Morgan Stewart
*Acting Director of the United States Patent and Trademark Office*